United States Patent
Rodgers (10) Patent No.: US 6,703,675 B1
(45) Date of Patent: Mar. 9, 2004

(54) PARTICLE FILTER FOR PARTIALLY ENCLOSED MICROELECTROMECHANICAL SYSTEMS

(75) Inventor: Murray Steven Rodgers, Albuquerque, NM (US)

(73) Assignee: Memx, Inc., Albuquerque, NM (US)

(*) Notice: Subject to any disclaimer, the term of this patent is extended or adjusted under 35 U.S.C. 154(b) by 0 days.

(21) Appl. No.: 10/224,179

(22) Filed: Aug. 20, 2002

(51) Int. Cl.[7] ............................................... H01L 29/82
(52) U.S. Cl. ...................................... 257/415; 257/419
(58) Field of Search ................................ 257/415, 419

(56) References Cited

U.S. PATENT DOCUMENTS

| | | | |
|---|---|---|---|
| 5,107,328 A | 4/1992 | Kinsman | 357/74 |
| 5,435,876 A | 7/1995 | Alfaro et al. | 156/247 |
| 5,605,489 A | 2/1997 | Gale et al. | 451/28 |
| 5,872,046 A | 2/1999 | Kaeriyama et al. | 438/465 |
| 5,923,995 A | 7/1999 | Kao et al. | 438/460 |
| 6,012,336 A * | 1/2000 | Eaton et al. | 73/720 |
| 6,063,696 A | 5/2000 | Brenner et al. | 438/465 |
| 6,335,224 B1 | 1/2002 | Peterson et al. | 438/114 |

OTHER PUBLICATIONS

U.S. application No. 10/223984 by Rodgers, entitled "Dust Cover for MEM Components", filed on Aug. 20, 2002.

U.S. application No. 10/223987 by Rodgers, entitled "Particle Filter for Microelectromechanical Systems", filed on Aug. 20, 2002.

* cited by examiner

*Primary Examiner*—Douglas Wille
(74) *Attorney, Agent, or Firm*—Marsh Fischmann & Breyfogle LLP (57) ABSTRACT

A particle filter for a partially enclosed microelectromechanical systems that include a substrate material having at least one micro-device formed thereon. The particle filter includes a first structural layer forming a filter bottom and a second structural layer forming a filter wall. The filter bottom and filter wall are interconnected by at least one support feature to define a particle trap between the filter wall and filter bottom. The particle trap is a gap formed by mating, but non-interconnected portions of the filter wall and filter bottom that operates to trap and prevent particles from passing beyond the filter bottom into the microelectromechanical system.

30 Claims, 8 Drawing Sheets

PARTICLE FILTER FOR PARTIALLY ENCLOSED MICROELECTROMECHANICAL SYSTEMS

FIELD OF THE INVENTION

The invention is related to the field of microelectromechanical systems, and, in particular, to a particle filter for a partially enclosed microelectromechanical system that reduces or prevents particulate contamination of the microdevices that make up the system.

BACKGROUND OF THE INVENTION

There are a number of fabrication technologies, collectively known as micromachining, for producing microelectromechanical systems. One type of micromachining process is surface micromachining. Surface micromachining involves deposition and photolithographic patterning of alternate layers of structural material (typically polycrystalline silicone, termed polysilicon) and sacrificial layers (typically silicon dioxide, termed oxide) on a silicon wafer substrate material. Using a series of deposition and patterning, functional devices are constructed layer by layer. After a device is completed, it is released by removing all or some of the remaining sacrificial material by exposure to a selective etchant such as hydrofluoric acid, which does not substantially attack the polysilicon layers.

Unfortunately, it is a problem in the art of microelectromechanical systems to prevent particle contamination. Particle contamination can potentially ruin an entire system by interfering with the electrical signals and/or mechanical movements of some or all of the electrical and/or mechanical devices.

One solution to this problem is to provide a cover over the microelectromechanical system that at least partially encloses the system and protects enclosed components from particle contamination. When covers are utilized or otherwise when there are structural features having substantial coverage area, etch release apertures in such structure are typically utilized to introduce etchant for removal of the sacrificial material and release of internal devices. These etch release apertures typically include openings on the order of about 1.25 microns in size. Unfortunately, however, these openings still permit the introduction of particles that are large enough to cause mechanical obstructions or electrical shorts in the internal devices.

SUMMARY OF THE INVENTION

It is therefore an object of the present invention to provide a particle filter and method of fabricating the same for microelectromechanical systems that are at least partially enclosed by a cover or other similar structure. It is another object of the present invention to provide a plurality of configurations for the particle filter to accommodate different spatial limitations within microelectromechanical systems. It is still yet another object of the present invention to provide a particle filter that may be formed around etch release apertures in a cover to trap particles introduced through such apertures within the filter, thereby preventing contamination of internal components.

In carrying out the above objects, and other objects, features, and advantages of the present invention, a particle filter is provided that includes a first structural layer forming a filter bottom and a second structural layer forming a filter wall. The filter bottom and filter wall are interconnected by at least one support feature to define a particle trap between the filter wall and filter bottom. In that regard, the particle trap may be a gap formed by mating, but non-interconnected portions of the filter wall and filter bottom. The particle trap operates to trap particles within the gap to prevent particles from passing beyond the filter bottom and into the microelectromechanical system.

Various refinements exist of the features noted in relation to the subject particle filter. Further features may also be incorporated into the particle filter to form multiple examples of the present invention. These refinements and additional features will be apparent from the following description and may exist individually or in any combination. For instance, the particle filter may also include a filter top. In this regard, the filter wall may be formed as part of the filter top, which in turn is a portion of a cover for the microelectromechanical system. Further, in this regard, the particle filter may be formed so that the filter wall encloses an area circumscribing one or more etch release apertures formed in the cover to prevent particulate contamination through the same.

The filter bottom on the other hand, may be formed in a plurality of geometric configurations to accommodate spatial limitations within a microelectromechanical system. In this regard, the filter wall may overlap a top portion of the filter bottom to define a particle trap that includes a substantially right angle at the overlap of the filter wall and filter bottom to improve efficiency.

In carrying out the above objects, and other objects, features, and advantages of the present invention, a microelectromechanical system is provided that includes at least a substrate material having at least one micro-device formed on the substrate material. The microelectromechanical system also includes at least one particle filter to prevent particles from entering the microelectromechanical system. Various refinements exist of the features noted in relation to the subject microelectromechanical system. Further features may also be incorporated into the microelectromechanical system to form multiple examples of the present invention. These refinements and additional features will be apparent from the following description and may exist individually or in any combination. For instance, the microelectromechanical system may also include a cover having at least one etch release aperture. In this regard, the particle filter may be formed between the cover and the substrate material around the at least one etch release aperture to prevent particulate contamination through the etch release aperture.

In carrying out the above objects, and other objects, features, and advantages of the present invention, a method of fabricating a particle filter for a microelectromechanical system is provided. The method includes the step of depositing and patterning a plurality of alternating layers of filter forming material and sacrificial material on a substrate material to form at least one filter bottom and at least one filter wall. The method also includes removing the sacrificial material to release the at least one filter bottom and the at least one filter wall to define a particle trap between mating but non-interconnected portions of the filter bottom and the filter wall.

Various refinements exist of the features noted in relation to the present method. Further features may also be incorporated into the present method to form multiple examples of the invention. These refinements and additional features will be apparent from the following description and may exist individually or in any combination. For instance, the filter bottom and filter wall may be interconnected by at least one support feature. In another instance, the method may further include forming the filter wall as part of the filter top, which in turn is a portion of a cover for the microelectromechanical system. Further, in this regard, the particle filter may be formed so that the filter wall encloses an area circumscribing one or more etch release apertures formed in the cover to prevent particulate contamination through the same. The method may further include patterning the filter bottom into a predetermined one of a plurality of geometric configurations to accommodate spatial limitations in a microelectromechanical system. In this regard, the filter wall may overlap a top portion of the filter bottom to define a particle trap that includes a substantially right angle at the overlap of the filter wall and filter bottom to improve efficiency.

In the context of the present invention, the first, second, and third, etc. connotations used in reference to the layers are used for the purpose of differentiating between different layers and are not used to indicate a fabrication sequence or structural sequence.

DETAILED DESCRIPTION

Reference will now be made to the accompanying drawings, which at least assist in illustrating the various pertinent features of the present invention. For purposes of illustration, the following description is related to the formation of particle filters for microelectromechanical (MEM) systems, although it will be appreciated that the present particle filters are easily formed and useful for both micromechanical and microelectromechanical systems. In addition, one or more micro-devices or microstructures may define any given micromechanical or microelectromechanical system.

Surface micromachining is a preferred type of technique for fabricating the particle filters described herein, although other techniques may be utilized as well. Moreover, in certain instances it may be desirable to use a combination of two or more fabrication techniques to define a given MEM system. Since surface micromachining is the preferred fabrication technique for the MEM systems described herein, the basic principles of surface micromachining will first be described. Initially, various surface micromachined microstructures and surface micromachining techniques are disclosed in U.S. Pat. No. 5,783,340, issued Jul. 21, 1998, and entitled "METHOD FOR PHOTOLITHOGRAPHIC DEFINITION OF RECESSED FEATURES ON A SEMICONDUCTOR WAFER UTILIZING AUTO-FOCUSING ALIGNMENT"; U.S. Pat. No. 5,798,283, issued Aug. 25, 1998, and entitled "METHOD FOR INTEGRATING MICROELECTROMECHANICAL DEVICES WITH ELECTRONIC CIRCUITRY; U.S. Pat. No. 5,804,084, issued Sep. 8, 1998, and entitled "USE OF CHEMICAL MECHANICAL POLISHING IN MICROMACHINING"; U.S. Pat. No. 5,867,302, issued Feb. 2, 1999, and entitled "BISTABLE MICROELECTROMECHANICAL ACTUATOR"; and U.S. Pat. No. 6,082,208, issued Jul. 4, 2000, and entitled "METHOD FOR FABRICATING FIVE-LEVEL MICROELECTROMECHANICAL STRUCTURES AND MICROELECTROMECHANICAL TRANSMISSION FORMED, the entire disclosures of which are incorporated by reference in their entirety herein.

Surface micromachining generally entails depositing typically alternate layers of structural material and sacrificial material using an appropriate substrate which functions as the foundation for the resulting microstructures. A dielectric isolation layer will typically be formed directly on an upper surface of the substrate on which a MEM system is to be fabricated, and a structural layer will be formed directly on an upper surface of the dielectric isolation layer. This particular structural layer is typically patterned and utilized for establishing various electrical interconnections for the MEM system, which is thereafter fabricated thereon. Other layers of sacrificial and structural materials are then sequentially deposited to define the various microstructures and devices of the MEM system. Various patterning operations may be executed on one or more of these layers before the next layer is deposited to define the desired microstructure. After the various microstructures are defined in this general manner, the desired portions of the various sacrificial layers are removed by exposing the "stack" to one or more etchants. This is commonly called "releasing." During releasing, at least certain of the microstructures are released from the substrate to allow some degree of relative movement between the microstructure(s) and the substrate. In certain situations, not all of the sacrificial material used in the fabrication is removed during the release. For instance, sacrificial material may be encased within a structural material to define a microstructure with desired characteristics (e.g., a prestressed elevator microstructure).

Surface micromachining can be done with any suitable system of a substrate, sacrificial film(s) or layer(s), and structural film(s) or layer(s). Many substrate materials may be used in surface micromachining operations, although the tendency is to use silicon wafers because of their ubiquitous presence and availability. The substrate again is essentially a foundation on which the microstructures are fabricated. This foundation material must be stable to the processes that are being used to define the microstructure(s) and cannot adversely affect the processing of the sacrificial/structural films that are being used to define the microstructure(s). With regard to the sacrificial and structural films, the primary differentiating factor is a selectivity difference between the sacrificial and structural films to the desired/required release etchant(s). This selectivity ratio may be five to one or even less but is preferably several hundred to one or much greater, with an infinite selectivity ratio being ideal. Examples of such a sacrificial film/structural film system include: various silicon oxides/various forms of silicon; poly germanium/poly germanium-silicon; various polymeric films/various metal films (e.g., photoresist/aluminum); various metals/various metals (e.g., aluminum/nickel); polysilicon/silicon carbide; silicone dioxide/polysilicon (i.e., using a different release etchant like potassium hydroxide, for example).

Figure 1:
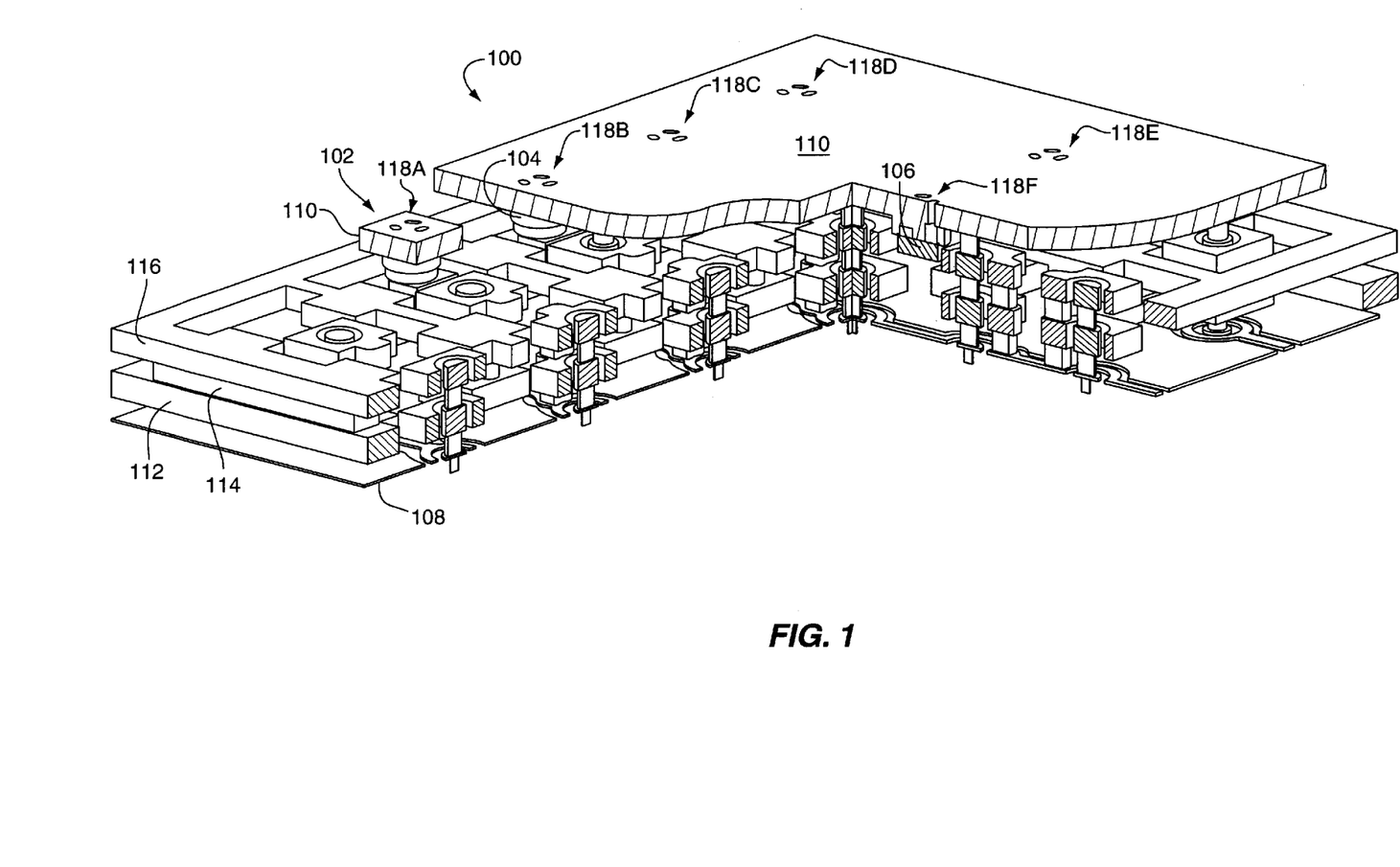
FIG. 1 illustrates an example of a microelectromechanical system configured with a filter system according to the present invention.

FIG. 1 illustrates an exemplary MEM system 100 configured with multiple particle filters, e.g. 102, 104, and 106 according to the present invention. MEM systems constructed by MEMX, Inc. of Albuquerque, N.Mex., such as MEM system 100 may include a first layer 108 that provides electrical interconnections and as many as five or more additional layers of mechanical polysilicon layers that form functional elements ranging from simple cantilevered beams to complex microengines connected to a gear train. MEM system 100 also includes a cover 110 to protect the electrical and mechanical layers 108 and 112–116 from particle contamination. Etch release apertures 118A–F in the cover 110 provide a means to introduce etchant during the release step to remove the remaining sacrificial material and release the mechanical and electrical devices in the layers 108 and 112–116. Such etch release apertures facilitate penetration of the etchant for improved yield. The etch release apertures 118A–F are typically on the order of about 1.25 microns in size. The particle filters, e.g. 102–106, are preferably formed around the etch release apertures 118A–F and operate to trap particles that may enter the MEM system 100 through the apertures 118A–F, thereby assuring that virtually no contamination may occur in the MEM system 100. The filters, e.g., 102–106, thus allow penetration of the etchant but impede ingress of particles of a size that may obstruct movement or cause short circuits.

Figure 2:
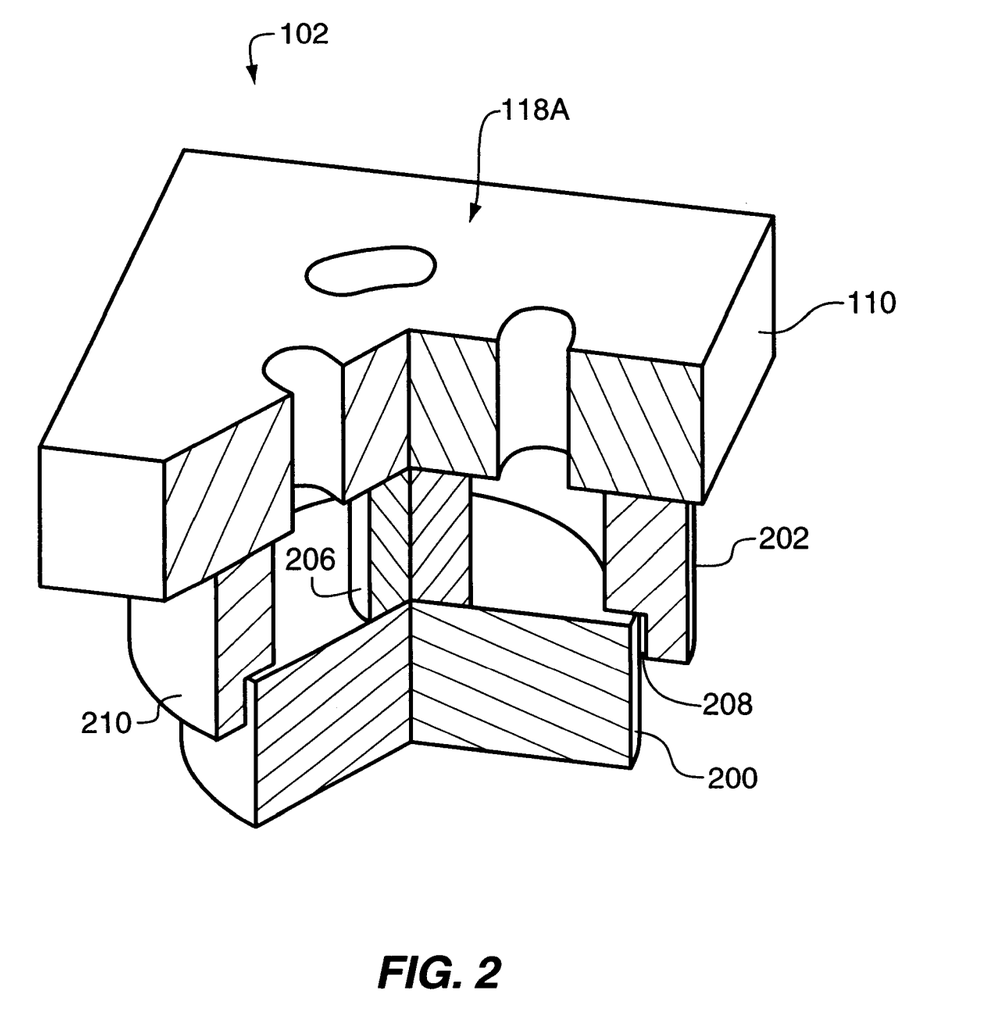
FIG. 2 illustrates an example of a filter system according to the present invention.

FIG. 2 illustrates a cut away perspective view of the particle filter 102. For purpose of illustration, the following description will now be directed toward the operation and fabrication of the illustrated particle filter 102, having an exemplary configuration and associated fabrication process. It will be appreciated however, that the following discussion applies equally to the particle filters 104 and 106, as well as other particle filters described herein, as well as other configurations and processes according to the invention.

The particle filter 102 includes a filter bottom 200 and filter wall 202. The filter wall 202 is interconnected to the filter bottom 200 by support feature 206, referred to herein as anchor post 206. The filter wall 202 may also be formed from at least one depending portion of the cover 110 over MEM system 100. In other words, a filter top may be provided by forming the filter wall 202 and cover 110 from the same deposition layer or integrally or otherwise interconnected layer portions in the MEM system 100.

In that regard, the filter wall 202 and filter bottom 200 define a particle trap 208 formed at the mating but non-sealably interconnected intersection of the filter wall 202 and filter bottom 200. That is, the filter wall 202 and bottom 200 interface so as to provide one or more openings dimensioned to allow penetration of etchant but capture certain particles that may have passed through an etchant aperture, e.g., 118A. As illustrated on FIG. 2, the filter wall 202 and filter bottom 200 are not actually connected, but rather, define a gap or space along the intersection that forms the particle trap 208. In this case, the anchor post 206 provides the interconnection between the filter wall 202 and filter bottom 200, via the filter top/cover 110. As may be appreciated, the dimension of the gap 208 is defined by the size of particle to be trapped within the filter 102. In this regard, the dimension of the gap 208 is preferably, in the range of 0.1 microns to 0.5 microns, and more preferably is 0.2 microns. Operationally, the particle trap 208 effectively traps particles entering the particle filter 102 within the gap 208, thereby preventing the particles from contaminating the mechanical and electrical micro-devices in the layers 108 and 112–116.

FIGS. 3–11 Illustrate one example of the fabrication of the particle filter 102. Only those portions of the MEM system 100 that are relevant to the present invention will be described herein. Those skilled in the art will appreciate, however, that since the particle filter 102 is preferably fabricated using micromachining, various other combinations of depositions and surface machining that are within the scope of the present invention exist to produce particle filters according to the principles disclosed herein.

Figure 3:
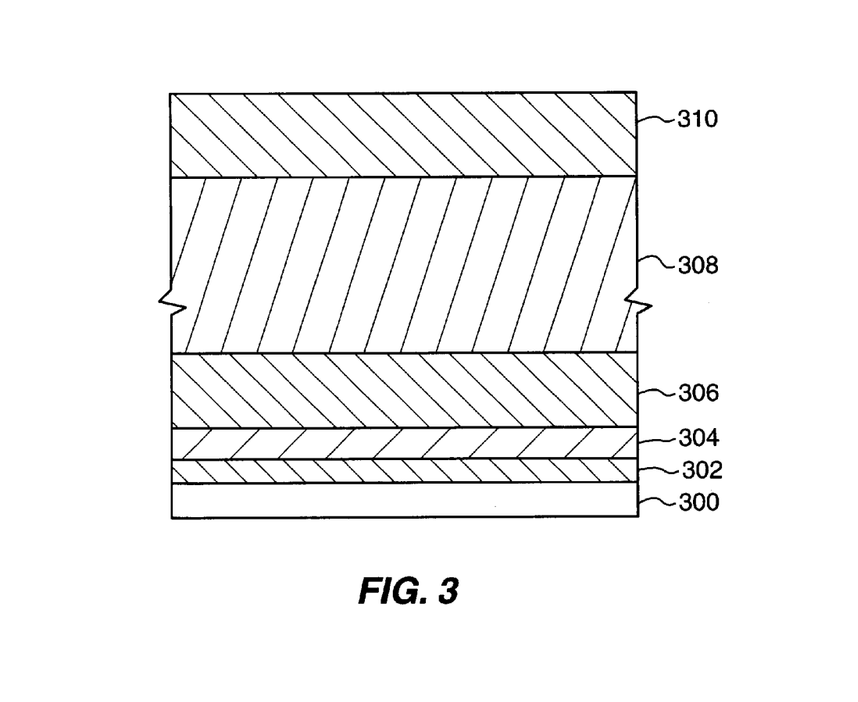
FIG. 3 illustrates an example of the fabrication of the filter system of FIG. 2.

Referring first to FIG. 3, there is shown a cross sectional view of the fabrication process for the particle filter 102 completed to the structural layer 310 forming the filter bottom 200. Specifically, the structure of FIG. 3 includes a substrate 300, dielectric isolation layers, 302 and 304, a pair of sacrificial layers, 306 and 308, and a structural layer 310. It should be noted that in the context of producing the. MEM system 100 the sacrificial layers, 306 and 308, may be structural layers such as structural layers 114 and 116. However, for purposes of clarity, the fabrication of the particle filter 102 is illustrated in FIGS. 3–11 utilizing sacrificial layers 306 and 308. In other words, to provide a clearer understanding of the present invention, sacrificial layers, 306 and 308, are shown on FIGS. 3–11 rather than structural layers 114 and 116.

The dielectric isolation layers, 302 and 304, may be a thermal oxide layer and silicon nitride layer respectively, formed by a conventional thermal diffusion process as is well known in the integrated circuit art. In addition, chemical-mechanical polishing may be utilized to adjust the thickness and planarity of the layers, e.g. layers 302–310. The term "substrate" as used herein means those types of structures that can be handled by the types of equipment and processes that are used to fabricate microdevices and/or microstructures on, within, and/or from a substrate using one or more micro-photolithographic patterns.

Exemplary materials for the sacrificial layers, 306 and 308, as well as other sacrificial layers utilized to form the particle filter 102 include undoped silicon dioxide or silicon oxide, and doped silicon dioxide or silicon oxide ("doped" indicating that additional elemental materials are added to the film during or after deposition). Exemplary materials for the structural layer 310 as well as other structural layers that form the particle filter 102 include doped or undoped polysilicon and doped or undoped silicon. Exemplary materials for the substrate 300 include silicon. The various layers described herein may be formed/deposited by techniques such as chemical vapor deposition (CVD) and including low-pressure CVD (LPCVD), atmospheric-pressure CVD (APCVD), and plasma-enhanced CVD (PECVD), thermal oxidation processes, and physical vapor deposition (PVD), and including evaporative PVD, and sputtering PVD, and chemical-mechanical polishing (CMP) as examples.

Figure 4:
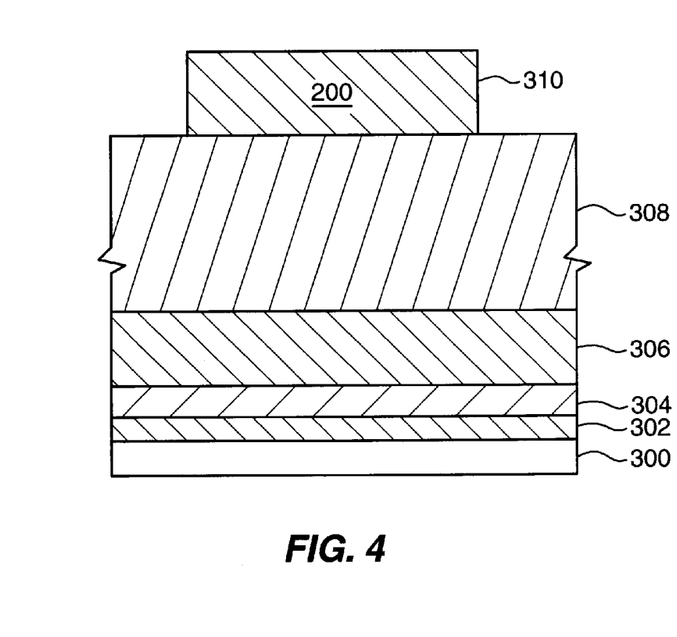
FIG. 4 illustrates additional details of the fabrication of the filter system of FIG. 2.

After formation of the structure of FIG. 3, the structural layer 310 may be patterned using photolithographic masking and etching into the shape of the filter bottom 200, as illustrated in FIG. 4. In this regard and, a thin layer of light sensitive photoresist may be spun onto the layer 310. The layer 310 may then be exposed to light using an oxide mask. After etching, the remaining photoresist may then be stripped away resulting in the structure of FIG. 4. As will become apparent from the following description, the filter bottom 200 may be patterned into a variety of shapes as a matter of design choice to accommodate different spatial configurations and limitations within a MEM system, such as MEM system 100.

Figure 5:
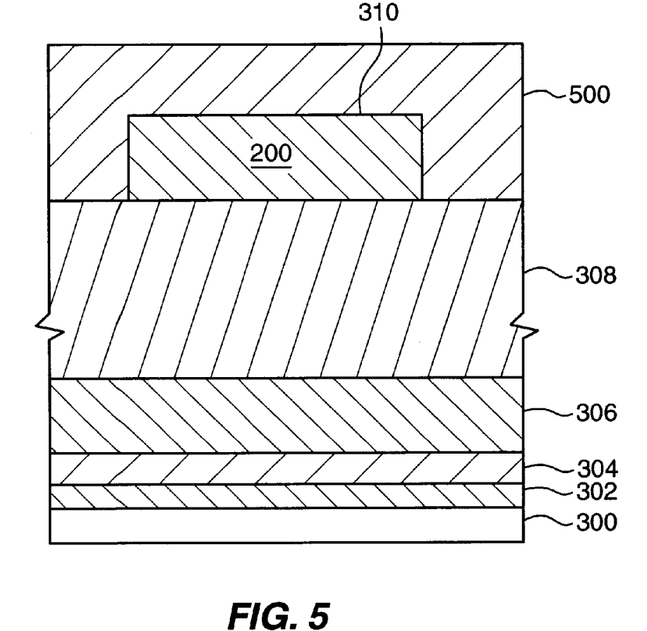
FIG. 5 illustrates additional details of the fabrication of the filter system of FIG. 2.
Figure 6:
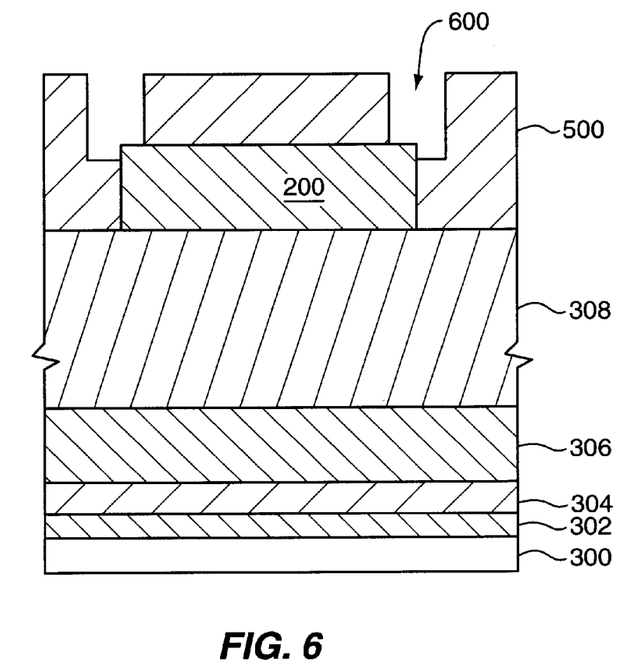
FIG. 6 illustrates additional details of the fabrication of the filter system of FIG. 2.

Referring to FIG. 5, after patterning of the, filter bottom 200, another layer 500 of sacrificial material is deposited onto the patterned layer 310. It should be noted, however, that while the sacrificial layer 500 is shown in a planarized state, such as could be achieved through chemical-mechanical polishing, planarization is not necessary to the fabrication of the particle filter 102. Referring to FIG. 6, the sacrificial layer 500 is patterned using a cut etch to form a circumferential annular void 600 within the sacrificial layer 500. The circumferential annular void 600 will eventually become the filter wall 204 for the particle filter 102. It should also be noted that the void 600 is etched all the way down to the structural layer 310/filter bottom 200 and slightly overlaps the side of the structural layer 310 or in other words the top portion of the filter bottom 200. The overlap is not necessary to the formation of the particle filter 102, but rather, increases the efficiency of the particle filter 102 as it forms the lip 210 (shown on FIG. 2) of the particle trap 208, which further restricts particles passing through the particle trap 208.

Figure 7:
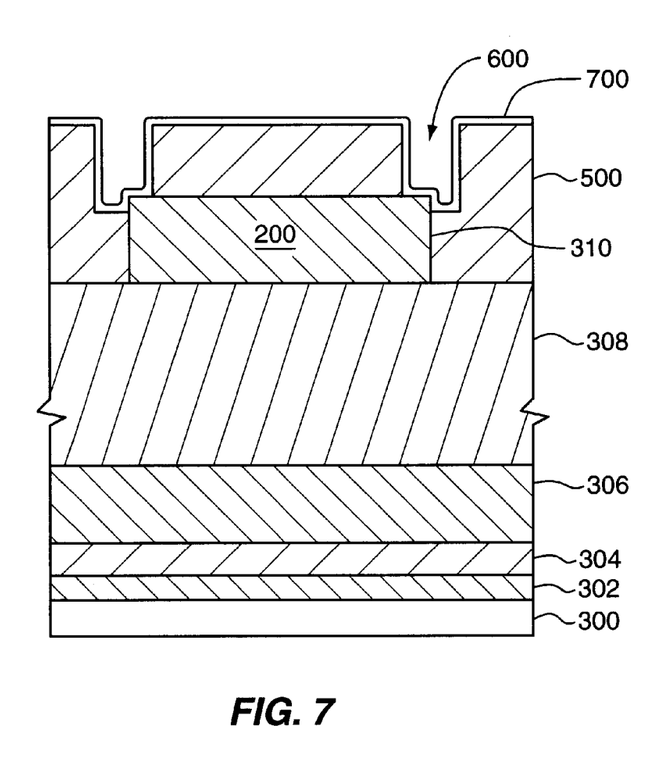
FIG. 7 illustrates additional details of the fabrication of the filter system of FIG. 2.
Figure 8:
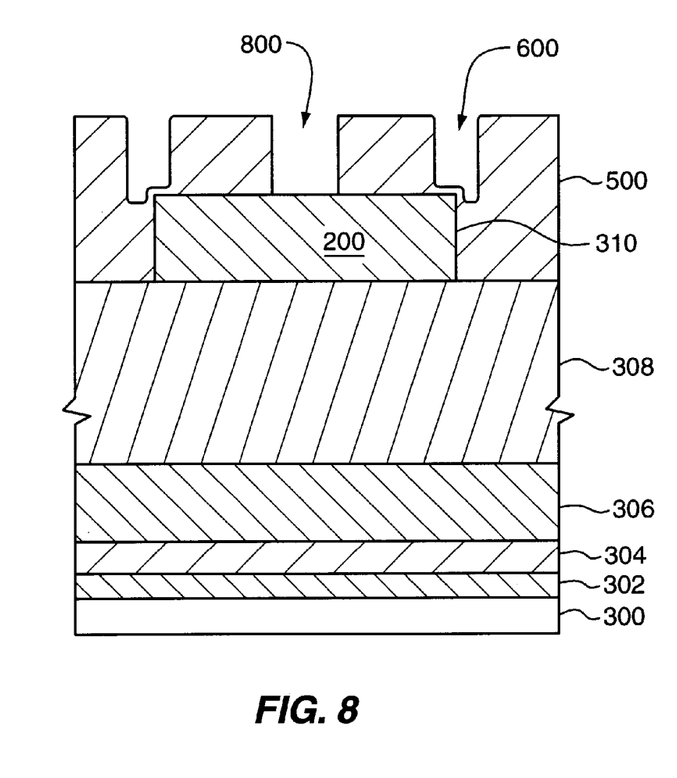
FIG. 8 illustrates additional details of the fabrication of the filter system of FIG. 2.

Referring to FIG. 7, after etching of the void 600, a thin layer of sacrificial material 700 is applied to backfill void 600. The thickness of the backfill layer 700 determines the gap spacing of the particle trap 208 and therefore is precisely controlled during the backfill process. In that regard, the thickness of the backfill layer 700 is preferably in the range of 0.1 microns to 0.5 microns and more preferably is 0.2 microns. It should also be noted since the layer 700 is generally the same or similar material as the sacrificial layer 500 it essentially becomes part of the layer 500 as shown in FIG. 8. Alternatively a timed etch to the desired depth may be utilized to form the void 600, thus eliminating the need for the backfill layer 700. As will be appreciated by those skilled in the art, however, the backfill method eliminates many of the difficulties associated with timed etching, e.g. knowledge of the precise thickness of the sacrificial layer 500. Still referring to FIG. 8, the sacrificial layer 500 including the added material of layer 700 is again patterned using a cut etch to form a substantially central annular void 800. The central annular void 800 will eventually become the anchor post 206 for the particle filter 102.

Figure 9:
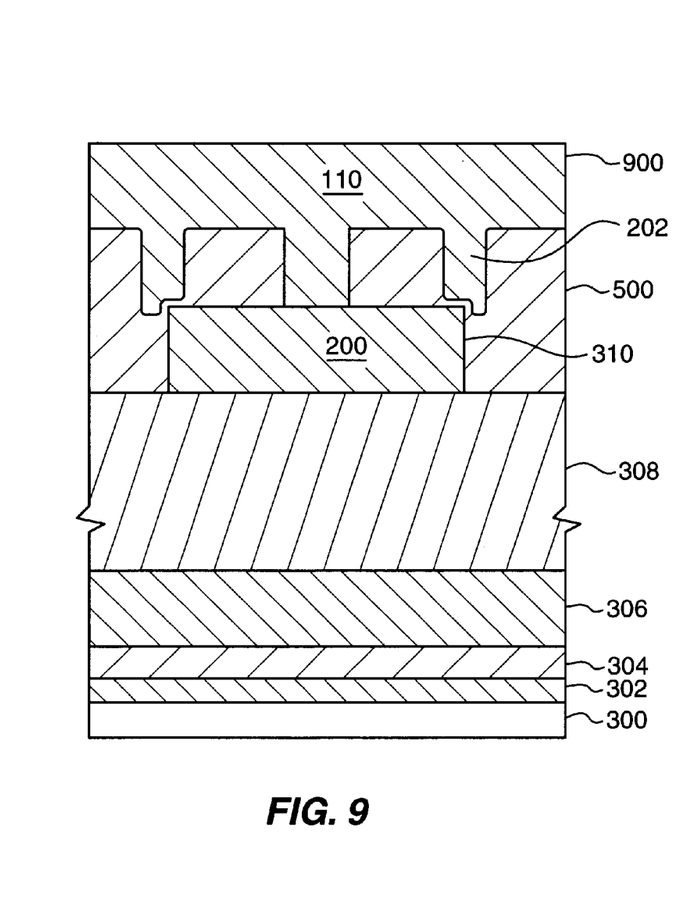
FIG. 9 illustrates additional details of the fabrication of the filter system of FIG. 2.
Figure 10:
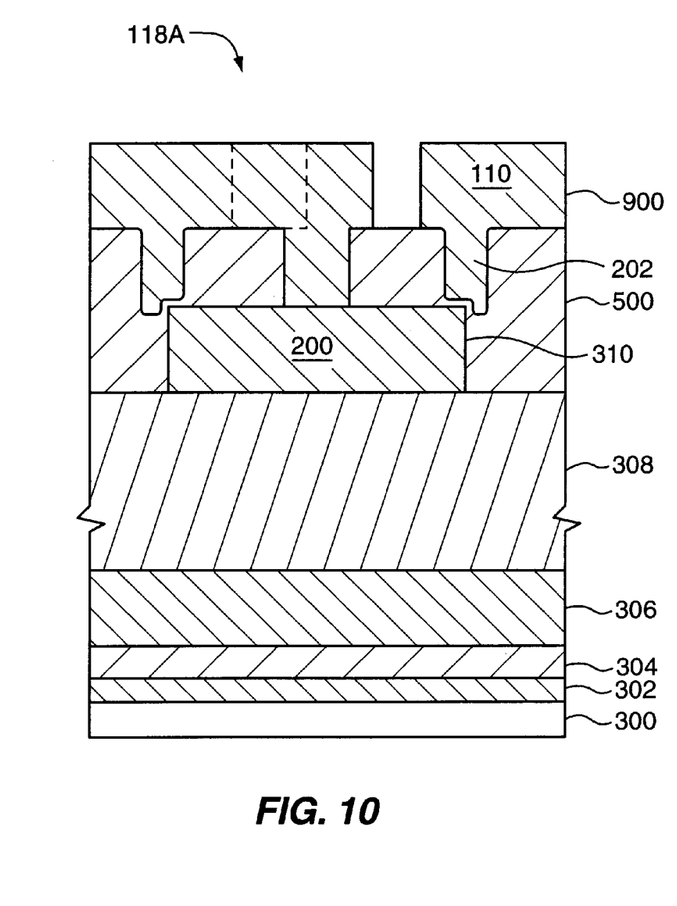
FIG. 10 illustrates additional details of the fabrication of the filter system of FIG. 2.

Referring to FIG. 9, after the sacrificial backfill layer 700 is deposited and void 800 etched, another structural layer 900 is deposited and planarized. Again as will be appreciated the planarization is not necessary to the formation and/or operation of the particle filter 102. The structural layer 900 forms the filter wall 202, anchor 206, and the top cover 110. Referring to FIG. 10, after deposition and planarization of the layer 900, etch release apertures 118A are cut into the layer 900 to provide the means for introducing the chemical etchant used to release the particle filter 102 and or other microdevices and/or microstructures in a MEM system, such as MEM system 100.

Figure 11:
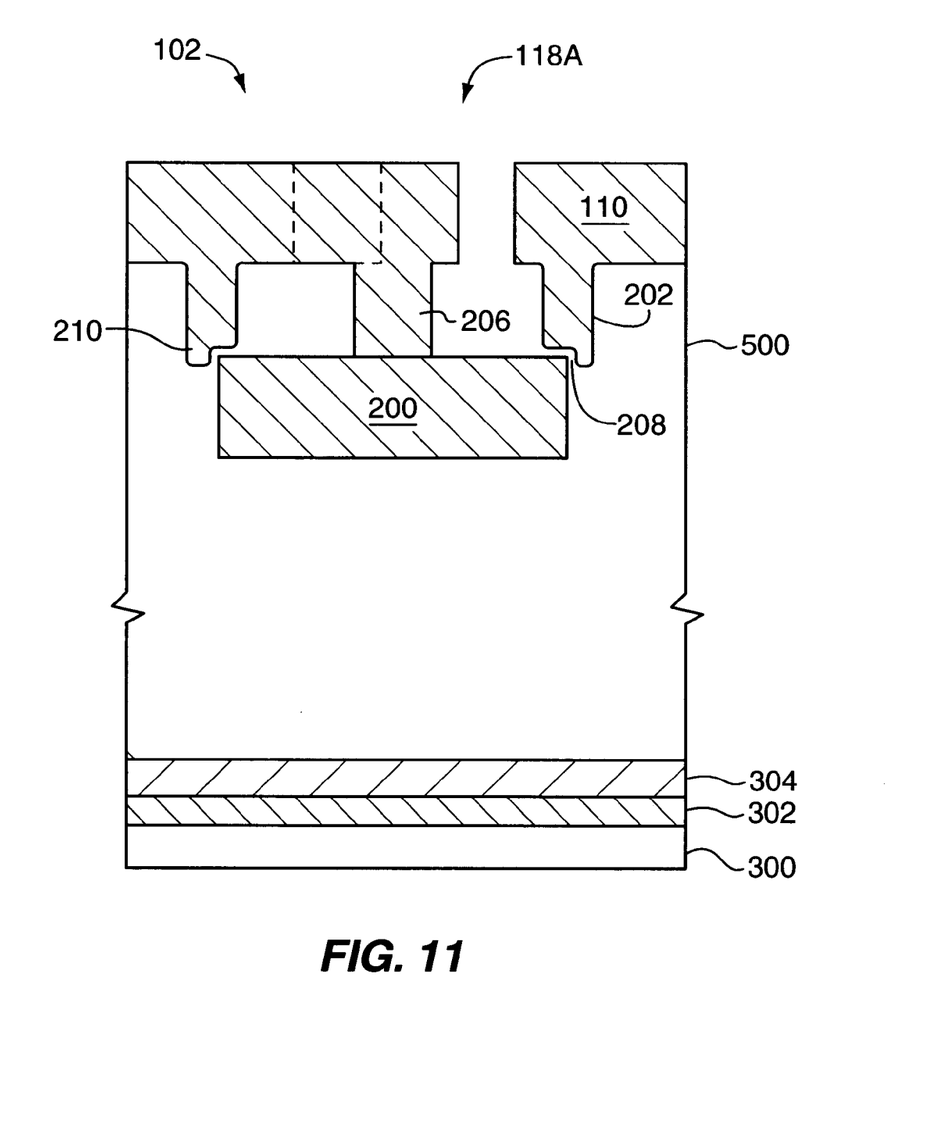
FIG. 11 illustrates additional details of the fabrication of the filter system of FIG. 2.
Figure 12:
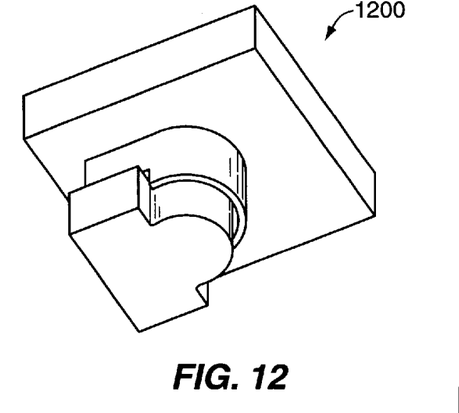
FIG. 12 illustrates another example of a filter system according to the present invention.
Figure 13:
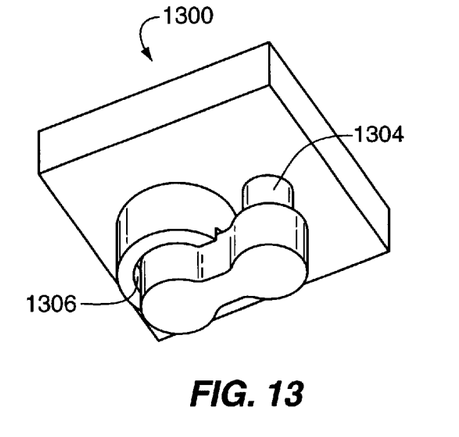
FIG. 13 illustrates another example of a filter system according to the present invention.
Figure 14:
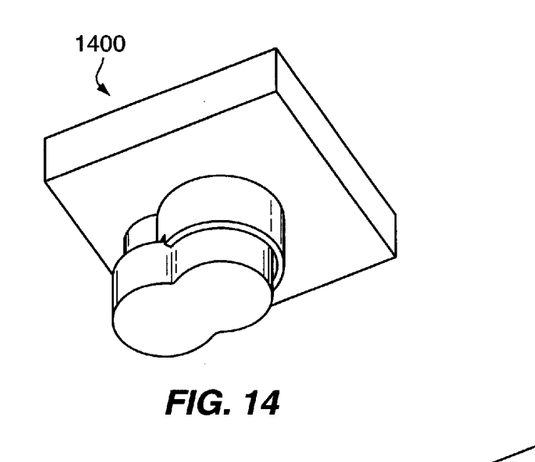
FIG. 14 illustrates another example of a filter system according to the present invention.
Figure 15:
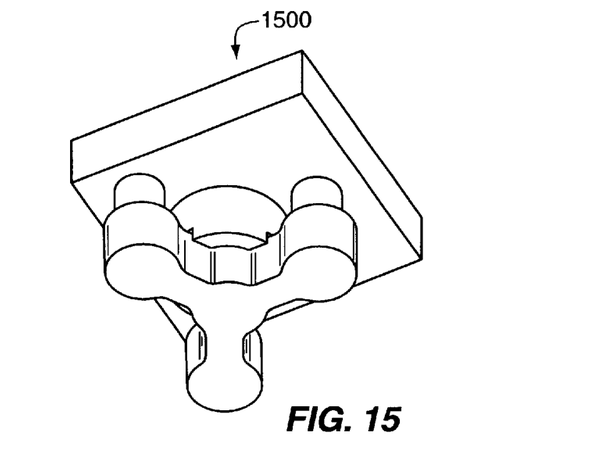
FIG. 15 illustrates another example of a filter system according to the present invention.

Referring to FIG. 11, the etch release step utilizes a selective etchant that etches away exposed portions of the sacrificial layers 306, 308, and 500 over time, while leaving the polysilicon structural layers 302, 304, and 310 intact to form/release the particle filter 102. Examples of release etchants for silicon dioxide and silicon oxide sacrificial materials are typically hydrofluoric (HF) acid based (e.g., undiluted or concentrated HF acid, which is actually 49 wt % HF acid and 51 wt % water; concentrated HF acid with water; buffered HF acid (HF acid and ammonium fluoride)).

The completed particle filter 102 is supported in the MEM system 100 by the filter top/cover 110, which in turn supports the filter bottom 200 via the anchor post 206. Advantageously, this permits the formation of the particle trap 208 around the etch release apertures 118A. Also advantageously, in this regard, the particle filter 102 virtually eliminates the possibility of particle contamination as particles entering through the etch release apertures 118A are trapped by the particle trap 208. As stated above, the etch release apertures are on the order 1.25 microns in size while the particle trap is on the order of 0.2 microns in size.

Referring to FIGS. 12–15, a further advantage of the present invention is provided through various alternative embodiments of the present particle filter. The present particle filter can be constructed in a variety of geometrical shapes as a matter of design choice. Those skilled in the art will appreciate the slight variations in etching to achieve the various designs illustrated in FIGS. 12–15, and thus, a description is omitted for the purpose of brevity. Additionally, those skilled in the art will appreciate that the particle filters 1200–1500 are for purpose of illustration and not limitation and that numerous other designs can be formed according to the principles of the present invention.

The particle filters 1200–1500 operate substantially similarly to the particle filter 102 in that they include a particle trap defined by mating, but non-interconnected surfaces, of a filter wall and a filter bottom connected to the filter wall through a support feature. The particle filters 1200–1500, however, provide the advantage of accommodating various different spatial limitations created by the different microstructures that can be included in a MEM system such as MEM system 100. For example, particle filter 1300 includes a slightly smaller filter bottom 1302 and is externally supported by an anchor post 1304. Particle filters 1200, 1400 and 1500 all include variations of the principles of the present invention and may be incorporated into one or more MEM systems as a matter of design choice. In addition, it will be appreciated that a MEM system, such as system 100, could include one or more of the different filter designs, e.g. 102, and 1200–1500, in a single system as a matter of design choice.

Those skilled in the art will appreciate variations of the above-described embodiments that fall within the scope of the invention. As a result, the invention is not limited to the specific examples and illustrations discussed above, but only by the following claims and their equivalents.

We claim:

1. A particle filter for at least partially enclosed microelectromechanical systems, the microelectromechanical systems including a substrate material having at least one micro-device formed thereon, the particle filter comprising:
   first structure forming a filter bottom;
   second structure forming a filter wall;
   at least one support feature interconnecting the filter bottom and the filter wall; and
   a particle trap defined between interfacing portions of the filter bottom and the filter wall to trap particles therebetween.

2. The particle filter of claim 1 comprising:
a filter top that includes at least one etch release aperture formed therein.

3. The particle filter of claim 2, wherein the filter wall at least partially encloses an area below and circumscribing the at least one etch release aperture.

4. The particle filter of claim 1, wherein the filter bottom is a predetermined one of a plurality of geometric configurations.

5. The particle filter of claim 4, wherein the filter wall at least partially circumscribes a top portion of the filter bottom to define the particle trap.

6. The particle filter of claim 5, wherein the particle trap comprises:
a gap of pre-determined dimension formed between non-interconnected portions of the filter bottom and filter wall.

7. The particle filter of claim 6, wherein the filter wall overlaps the top portion of the filter bottom to form the gap between the non-interconnected portions of the filter bottom and filter wall.

8. A microelectromechanical system comprising:
a substrate material;
at least one movable component formed on the substrate material;
a cover formed over the substrate material and extending over the movable component for protecting the movable component from particles in an ambient environment, wherein the cover includes at least one etch release aperture; and
at least one particle filter between the substrate material and the cover to trap particles entering the microelectromechanical system through the at least one cover.

9. The system of claim 8, wherein the at least one particle filter is formed between the substrate material and the top cover around the at least one etch release aperture.

10. The system of claim 8, wherein the at least one particle filter comprises:
a first structural layer forming a filter bottom;
a second structural layer forming a filter wall;
at least one support feature interconnecting the filter bottom and the filter wall; and
a particle trap defined between non-interconnected portions of the filter bottom and the filter wall.

11. The system of claim 10, wherein the filter bottom is a predetermined one of a plurality of geometric configurations.

12. The system of claim 11, wherein the filter wall at least partially circumscribes a top portion of the filter bottom to define the particle trap.

13. The system of claim 12, wherein the particle trap comprises:
a gap of pre-determined dimension formed between the non-interconnected portions of the filter bottom and filter wall.

14. The system of claim 13, wherein the filter wall overlaps the top portion of the filter bottom to form the gap between the non-interconnected portions of the filter bottom and filter wall.

15. A particle filter for at least partially enclosed microelectromechanical systems, the microelectromechanical systems including a substrate material having at least one micro-device formed thereon, the particle filter comprising:
first structure forming a filter bottom;
second structure forming a filter wall transversely disposed and circumscribing an exit of at least one aperture defined in a filter top, wherein the at least one aperture passes through the filter top from an upper surface to a lower surface of the filter top;
at least one support feature interconnecting the filter bottom and the filter wall; and
a particle trap defined between interfacing portions of the filter bottom and the filter wall to trap particles passing through the at least one aperture.

16. The particle filter of claim 15, wherein the particle trap traps particles during construction of the microelectromechanical system.

17. The particle filter of claim 15, wherein the particle trap traps particles during operation of a completed microelectromechanical system.

18. The particle filter of claim 15, wherein the filter wall defines a first dimension greater than a maximum dimension of the aperture.

19. The particle filter of claim 15, wherein the at least one support feature interconnects the filter bottom and the filter wall to define a second dimension smaller than a minimum dimension of the at least one aperture.

20. A particle filter for at least partially enclosed microelectromechanical systems, the microelectromechanical systems including a substrate material having at least one micro-device formed thereon, the particle filter comprising:
first structure forming a filter bottom;
second structure forming a filter wall circumscribing an exit of at least one aperture defined in a filter top, wherein the filter wall defines a first dimension greater than a maximum dimension of the at least one aperture;
at least one support feature interconnecting the filter bottom and the filter wall; and
a particle trap between interfacing portions of the filter bottom and the filter wall to trap particles passing through the at least one aperture, wherein the particle trap defines a second dimension smaller than a minimum dimension of the at least one aperture.

21. The particle filter of claim 20, wherein the second dimension is in the range of seven percent to thirty-three percent of the size of the minimum dimension of the aperture.

22. The particle filter of claim 20, wherein the second dimension is thirteen percent of the size of the minimum dimension of the aperture.

23. A particle filter for at least partially enclosed microelectromechanical systems, the microelectromechanical systems including a substrate material having at least one micro-device formed thereon, the particle filter comprising:
first structure forming a filter bottom;
second structure forming a filter wall;
at least one support feature interconnecting the filter bottom and the filter wall; and
a particle trap defined between interfacing portions of the filter bottom and the filter wall to trap particles at least during operation of a completed microelectromechanical system.

24. The particle filter of claim 23 wherein the particle trap traps particles during construction of the microelectromechanical system.

25. The particle filter of claim 23 comprising:
a filter top that includes at least one etch release aperture formed therein.

26. The particle filter of claim 25, wherein the filter wall at least partially encloses an area below and circumscribing the at least one etch release aperture.

27. The particle filter of claim 23, wherein the filter bottom is a predetermined one of a plurality of geometric configurations.

28. The particle filter of claim 27, wherein the filter wall at least partially circumscribes a top portion of the filter bottom to define the particle trap.

29. The particle filter of claim 28, wherein the particle trap comprises:
a gap of pre-determined dimension formed between non-interconnected portions of the filter bottom and filter wall.

30. The particle filter of claim 29, wherein the filter wall overlaps the top portion of the filter bottom to form the gap between the non-interconnected portions of the filter bottom and filter wall.

* * * * *